(12) United States Patent
Nishida et al.

(10) Patent No.: US 8,610,170 B2
(45) Date of Patent: Dec. 17, 2013

(54) COMPOUND SEMICONDUCTOR LIGHT-RECEIVING ELEMENT ARRAY

(75) Inventors: Katsuhiko Nishida, Tsukuba (JP); Mutsuo Ogura, Tsukuba (JP)

(73) Assignee: Irspec Corporation, Tsukuba-shi (JP)

( * ) Notice: Subject to any disclaimer, the term of this patent is extended or adjusted under 35 U.S.C. 154(b) by 0 days.

(21) Appl. No.: 13/574,487

(22) PCT Filed: Jan. 11, 2011

(86) PCT No.: PCT/JP2011/050269
§ 371 (c)(1),
(2), (4) Date: Jul. 20, 2012

(87) PCT Pub. No.: WO2011/089949
PCT Pub. Date: Jul. 28, 2011

(65) Prior Publication Data
US 2012/0286328 A1 Nov. 15, 2012

(30) Foreign Application Priority Data
Jan. 25, 2010 (JP) .................................. 2010-012875

(51) Int. Cl.
*H01L 31/102* (2006.01)

(52) U.S. Cl.
USPC ..... 257/188; 257/189; 257/466; 257/E27.122

(58) Field of Classification Search
None
See application file for complete search history.

(56) References Cited

U.S. PATENT DOCUMENTS

| 4,999,696 | A | 3/1991 | Gentner et al. |
| 5,127,081 | A * | 6/1992 | Koren et al. ................. 385/130 |
| 5,177,581 | A | 1/1993 | Kubo et al. |
| 7,439,599 | B2 | 10/2008 | Gao et al. |
| 2005/0040429 | A1 * | 2/2005 | Uppal ........................... 257/190 |
| 2011/0193133 | A1 * | 8/2011 | Ogura ........................... 257/184 |

FOREIGN PATENT DOCUMENTS

| JP | 63-55980 A | 3/1988 |
| JP | 04-266070 A | 9/1992 |
| JP | H05-82829 | 4/1993 |
| JP | H05-259497 | 10/1993 |
| JP | 5-291605 A | 11/1993 |
| JP | 9-283786 A | 10/1997 |
| JP | 2001-144278 A | 5/2001 |
| JP | 2002-76425 A | 3/2002 |
| JP | 2002-100796 | 4/2002 |
| JP | 2007-281266 A | 10/2007 |
| JP | 2009-283603 A | 12/2009 |

* cited by examiner

*Primary Examiner* — Tan N Tran
*Assistant Examiner* — Scott R Wilson
(74) *Attorney, Agent, or Firm* — Manabu Kanesaka

(57) ABSTRACT

An array structure solves issues that exist in conventional compound semiconductor photodiode arrays, such as large cross talk, large surface leaks, large stray capacitance, narrow detection wavelength bands, and bad manufacturing yield, simultaneously. A photodiode array has, laminated upon a semiconductor substrate, a buffer layer (8) with a broad forbidden band width, an I-type (low concentration photosensitive layer (2) with a narrow forbidden band width, and an n-type semiconductor window layer (3) with a broad forbidden band width, wherein photodiode elements are electrically separated from adjacent elements, by doping the periphery of the p-type impurity, and the detection wavelength band is expanded, by making the n-type window layer (3) on the photosensitive layer (2) a thinner layer with crystal growth.

7 Claims, 12 Drawing Sheets

COMPOUND SEMICONDUCTOR LIGHT-RECEIVING ELEMENT ARRAY

RELATED APPLICATIONS

The present application is National Phase of International Application No. PCT/JP2011/050269 filed Jan. 11, 2011, and claims priority from Japanese Application No. 2010-012875, filed Jan. 25, 2010.

TECHNICAL FIELD

This invention relates to a compound semiconductor photodiode array having low dark current, wider wavelength range and very little crosstalk between the elements.

BACKGROUND ART

Photodetectors comprised of a compound semiconductor material system have sensitivity in the wavelength regions that silicon detectors do not cover have been widely used particularly in the infrared region as the most sensitive photodetector. Compound semiconductor photodiode arrays are in broad demand such as sensors for infrared spectroscopy, monitors for optical communications with wavelength division multiplexing, infrared image sensors and various industrial measurements. Compound semiconductor arrays mostly used in many ways are photodiode arrays having the light receiving layer of the InGaAs layer formed by epitaxial growth on the InP substrate. For the detection of longer wavelength of the near-mid infrared region, photodiode arrays comprised of the InSb system, the InAs system and the HgCdTe system have been used.

The dark current which determines the detection limit of semiconductor photodetector is originated both in the internal semiconductor material and in the semiconductor surface. In order to suppress the dark current due to the internal semiconductor material, it is effective to decrease the carrier generation by thermal excitation in the semiconductor layers other than the photosensitive layer used to absorb photons. In addition, the carrier generation rate due to thermal excitation is proportional to the square of the intrinsic carrier concentration in general, so that it is effective to place the photosensitive layer sandwiched by the semiconductor layers with large energy band gaps, that is, with lower intrinsic carrier concentrations in order to reduce the dark current. In addition, it is desirable to locate the metallurgical PN junction exposed to the surface of the semiconductor layers with a wide energy band gap in order to reduce the dark current originated in the semiconductor surface region.

For example, in the planar photodiode (PD) based on the InGaAs/InP system described in the document 1, the surface associated with high crystal defect density is covered with the InP layer that has a relatively large energy band gap, and the PN junction formed in the InGaAs photosensitive layer having a smaller band gap is not exposed to the surface. In the process to produce a planar type PD, a PN junction is formed by diffusing impurities from the surface selectively, and arrays are obtained by arranging PD elements in one-dimensional or two-dimensional array patterns.

This kind of structures are simple in fabrication process but have disadvantage that the cross-talk between the elements is high. This crosstalk is caused by the fact that carriers generated in the photosensitive layer flow easily into adjacent elements by carrier diffusion and induce output signal in adjacent elements. As a method to improve the crosstalk between the elements is to provide a light shielding mask between the elements as shown in the document 1. This method is effective to prevent the photo-excited current in the gap between the elements but it cannot prevent carriers generated just under the element from flowing into adjacent elements completely and moreover, the light shielding mask is invalid when arrays are configured to receive incident light from the substrate side. And also, to form a light-shielding mask on arrays with a narrow pitch less than 10 few micrometers induces problems in the production yield.

As a measure to improve the shortcomings of such planar type PD arrays, a method to isolate elements in a mesa type has been taken as shown in the documents 2, 3, 4, and 5. All these examples include the InGaAs photosensitive layer and the InP window layer formed on the N type InP substrate, and each element is isolated in mesa structures. These structures bring in some advantages that cross talk is substantially improved as compared with that of a planar structure, and a light-shielding mask is not necessary.

However, the metallurgical PN junction is exposed to the surface in the mesa structure formed in a compound semiconductor so that a surface leak current is significantly increased. The large surface leak current causes a noise and deteriorates the minimum light receiving sensitivity. The surface of the mesa has been passivated by a dielectric film such as silicon nitride film. In addition, the photosensitive layer of InGaAs is usually made as an I (intrinsic) layer with the carrier concentration as low as to the order of $10^{14}$ cm$^{-3}$ so that electrons tend to accumulate at the surface by defects and pollution at the interface between the surface dielectric film and the semiconductor surface, or by ions contained in the dielectric film, or by polarization of the dielectric film. Such accumulated electrons induce unstable electrical phenomenon as to invert the I type mesa surface area and deteriorate PD characteristics with time.

The mesa type PD array with a PIN structure is proposed in the document 6, which includes the InGaAs photosensitive layer and the N-type InP formed on the P-type InP layer for the purpose of obtaining a fast response when light incidents on the back surface. The PN junction of the photosensitive layer shown in the document 6 is protected either by the insulating film formed on the semiconductor side surface, or by the buried layer with high resistance but the crystal surface or the re-growth interface is in a depletion state so that the problem of surface leakage originated in crystal defects in the vicinity of the surface still remains.

The documents 7 and 8 describe PDs having a mesa structure where the PN junction with a narrow forbidden gap is not exposed to the surface. The dark current can be suppressed by heavily doped impurities with a diffusion method at the surface region of the PN junction exposed to the end face of the mesa structure to extinguish the depletion layer near the surface. However, in both, when PD elements are arranged in an array, it requires to form a PNP structure after removing the photosensitive layer and exposing the buffer layer with a large band gap on the surface to cut off the current in the mesa bottom layer and in order to ensure electrical isolation of each element. In these structures, the front of the impurity diffused layer requires to be kept inside in a buffer layer with the large energy band gap, and the fabrication process was complicated as acceptable control range of process conditions is narrow. In addition, in the case of the document 7, in order to form a PN junction of the photosensitive layer by impurity diffusion, there is a problem that the junction is formed in a relatively deep position, which reduces the sensitivity in the short wavelength side.

PRIOR ART PUBLICATIONS

Document 1: JP-A No. 2002-100796
Document 2: JP-A 1993-82829

Document 3: JP-A 2001-144278
Document 4: JP-A 1993-259497
Document 5: U.S. Pat. No. 7,439,599B2
Document 6: JP-A 2007-281266
Document 7: U.S. Pat. No. 4,999,696
Document 8: US 2011/0193133 A1 (PCT JP2009/067689)

In the planar PD of the InGaAs/InP system, the $In_{0.53}Ga_{0.47}As$ lattice-matched to InP is used and the cut-off wavelength is normally about 1.6 µm. As a means to further expand the range of wavelengths, for example, in the case of a conventional near-infrared PD of the InGaAs/InP system, the wavelength range can be extended from 1.6 µm to 2.4 µm by increasing the composition of In to 0.77 from 0.53 but the lattice mismatch of about 1.6% occurs. Crystal defects caused by lattice mismatch can be suppressed to some extent with graded crystal compositions or with super-lattice buffer layers inside of the photosensitive layer, but high density crystal defects remain in the epitaxial layer interface, and the dark current generated in these defects increases the shot noise.

In addition, at the interface between the photosensitive layer formed of a narrow energy band gap and the window layer formed of a wide band gap, a mismatch of the band structure, i.e., the band offset occurs, which generates the barrier potential in the valence band or the conduction band. In order to inject electrons generated optically in the photosensitive layer into the window layer efficiently, the band alignment must be designed so as to make the band offset of the conduction band smaller. And the band offset of the valence band must be smaller when holes are injected into the window layer. It is because retention of the carriers in the interface causes degradation of the PD response time or reduction of sensitivity when the bias is set at zero voltage.

A PD array is generally used as a light detector module usually in combination with a silicon readout IC (ROIC). As a ROIC is driven by the supply voltage of 3 to 5V, the bias voltage applied to the PD is desirable to be in the range from 0V to the ROIC power supply voltage. In order to operate a PD at such a low voltage it is necessary to properly design the abovementioned band offset.

DISCLOSURE OF THE INVENTION

In order to realize the abovementioned purpose, the present invention proposes array structures that solve issues that exist in conventional compound semiconductor photodiode arrays, such as large cross talk, large surface leaks, large stray capacitance, narrow detection wavelength bands, and bad manufacturing yield, simultaneously.

Provided is a compound semiconductor photo-detection array, laminated upon a buffer layer with a wide energy band gap, a photosensitive layer with a narrow energy band gap, and the compound semiconductor window layer of the first conductivity type with a wide energy band gap, wherein at least the photosensitive layer and the periphery of the window layer of each of the elements are doped with impurities of the second conductivity type to separate electrically from adjacent elements.

Moreover, provided is a compound semiconductor photo-detection array wherein $\Delta Ec_{23}$ is less than $\Delta Ev_{23}$ when the photosensitive layer and the window have the N-type conductivity, and $\Delta Ec_{23}$ is larger than $\Delta Ev_{23}$ when the photosensitive layer and the window have the P-type conductivity. Here, the band offset in the conduction band and the valence band at the joint interface of the window layer and the photosensitive layer are assumed as $\Delta Ec_{23}$ and $\Delta Ev_{23}$ respectively.

Effect of Invention

In the structure of the present invention, the photosensitive layer is completely isolated from adjacent elements by a potential barrier in the horizontal direction built in the PN junction so that it is possible to prevent photo-generated carriers to flow into adjacent elements. Also, since the photosensitive layer is separated from the surface layer by the window layer, it is not affected by the quality of the dielectric surface passivation film and stable over time. In addition, since the crosstalk can be suppressed without forming the mesa structure or providing a light shielding mask between the elements, it becomes easier to manufacture an array of narrow pitch. Since the PN junction to form the photo-detection region is made by epitaxial growth rather than by thermal diffusion method, the characteristics are uniform and production yield is high. This point is important from the viewpoint of productivity particularly in fabricating large scale arrays.

The epitaxial growth allows to control the layer thickness in a few nanometers scale and by making the window layer formed by epitaxial growth less than 0.2 µm in thickness, so that the PN junction depth can be formed thinner than that is formed by thermal diffusion method. The detectable short wavelength edge of the conventional InP/InGaAs PD with the InP window layer was about 900 nm but according to the present invention, the short wavelength side can be extended to about 500 nm.

In addition, for the PD according to the present invention, it is possible to form electrodes for the first and second conductivity types only on the surface side, therefore, the substrate and the buffer layer needed for epitaxial growth do not have to be used as a current path. In this case, even if the crystal defects existing in the interface between the substrate and the buffer layer or defects due to lattice mismatch in the buffer layer, it is possible to avoid the influence of dark current due to such defects. Therefore, the photo-detection wavelength range of the photo absorbing layer can be greatly extended by using a mixed crystal semiconductor of which lattice constant is much different from that of substrate.

In addition, by increasing the potential barrier only for minority carriers in the surface window layer selectively, light generated carriers can lead to electrodes without retention. Because common electrodes of conventional planar PDs are N type and electrodes of separated array elements are P type, it is necessary to bias the common electrode to the positive potential. Therefore, it is necessary to insulate the substrate of the PD from the package.

On the other hand, in the present invention, the signal output electrodes, that is, positive potential can be formed on the N-type layer of each PD element and the common electrode can be made on the P type layer. Therefore, the virtual ground voltage of an ROIC is set to about ½ of the bias voltage usually, so that the appropriate bias voltage can be obtained by setting the common electrode at zero potential and just connecting each array element to the input current terminal of the ROIC.

DESCRIPTION OF THE PREFERRED EMBODIMENTS

Example 1

Figures 1A, 1B:
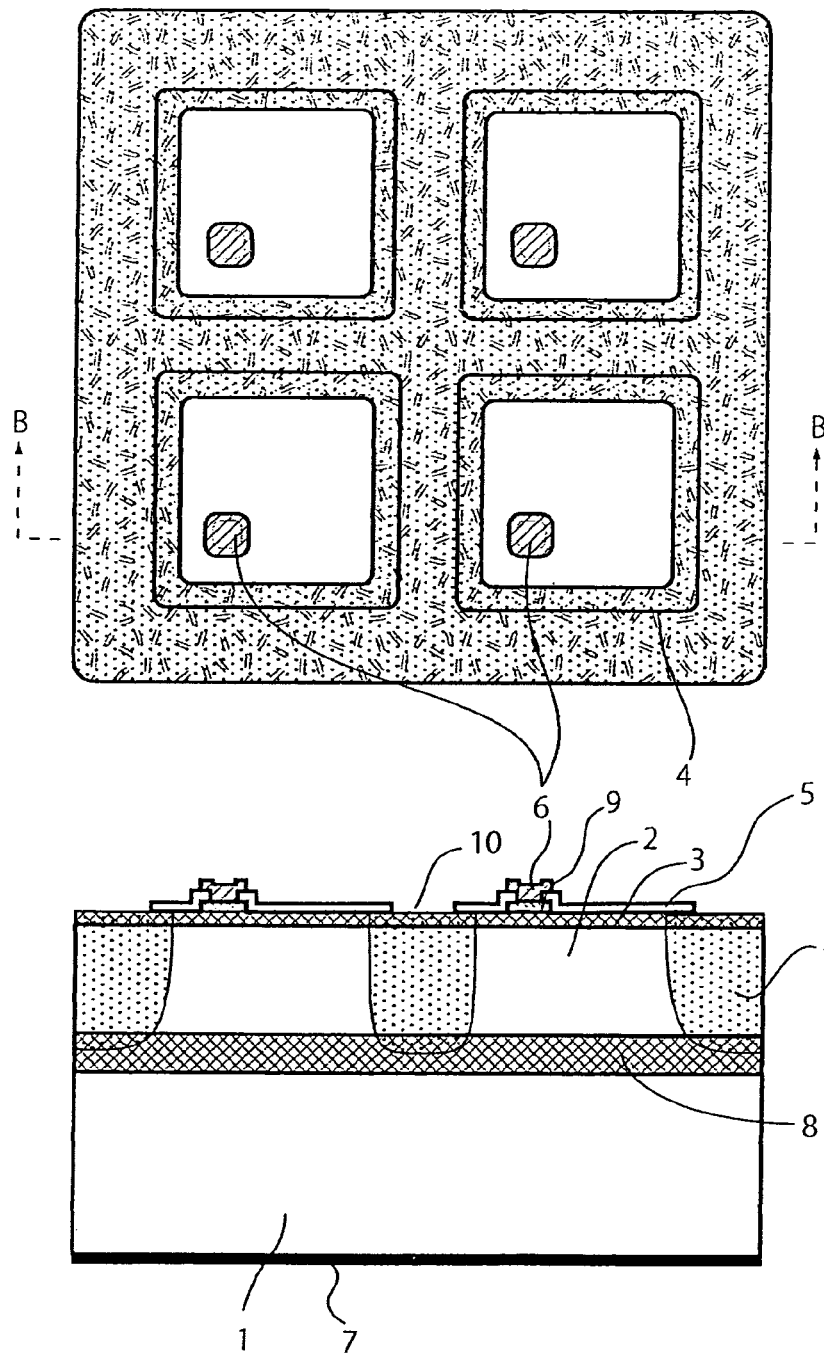
FIGS. 1(A) and 1(B) are explanatory illustrations of a compound semiconductor photo detecting array as a preferred first embodiment of this invention.

FIGS. 1(A) and 1(B) show an example of a planar array PD as an embodiment of this invention which is formed by deep zinc diffusion. FIG. 1(A) is a plan view, FIG. 1(B) shows a cross-sectional view of the element along B-B line. The carrier concentration of a P-type InP substrate is set to the order of $10^{18}$ to $10^{19}$ cm$^{-3}$ which enables to obtain ohmic characteristics easily when the P side electrode 7 is formed on the substrate. An InGaAs photosensitive layer 2 can be an undoped I (intrinsic) layer or a low concentration N-type layer with $10^{14}$ to $10^{15}$ cm$^{-3}$ carrier concentration. The InGaAs photosensitive layer 2 is used as a light-absorbing layer and can be replaced with any composition of In$_x$Ga$_{1-x}$As$_y$P$_{1-y}$ in order to provide the selectivity of the detection wavelength, or it is also possible to change to an InAlAs system composition to extend the detection wavelength. The thickness of the photosensitive layer 2 is determined by the conditions to optimize the response speed and quantum efficiency, and is about 1 µm thickness for high speed applications or about 2 to 6 µm to give priority to the quantum efficiency. In applications to have a sensitivity to the visible light region, an N-type InP window layer 3 is preferably less than 0.2 µm, while it is usually less than 1 µm. The carrier concentration of the N-type InP window layer 3 is set to the order of $10^{17}$ cm$^{-3}$ or more than that. The carrier concentration of the InP window layer 3 can be lower than this, by setting a high concentration N-type InGaAs contact layer placed under the electrode.

A P-type layer 4 is formed by diffusing zinc to the depth of a buffer layer 8 selectively through the opening of the dielectric film 5, to perform the separation between the elements. In this case, the photosensitive layer 2 is low concentration N-type, the window layer 3 N-type and the buffer layer 8 P-type. The buffer layer 8 is P-type or can be a semi-insulating type or N-type if a P-side electrode 10 is provided on the zinc diffused surface. However, when the buffer layer 8 is N-type, it is desirable to convert its peripheral to P-type.

The P-type layer 4 in Example 1 may be formed by buried growth of a large band gap semiconductor such as InP, or preferably formed by solid-phase diffusion through the buried growth layer with a higher P-type doping concentration in order to form a PN junction inside the photosensitive layer to avoid an effect of crystal defects in the re-growth interface. Crosstalk between the elements can be reduced significantly compared to the conventional planar PD array in the structure shown in FIG. 1 because adjacent PD elements are electrically isolated from each other by an NPN junction.

Example 2

Figure 2A:
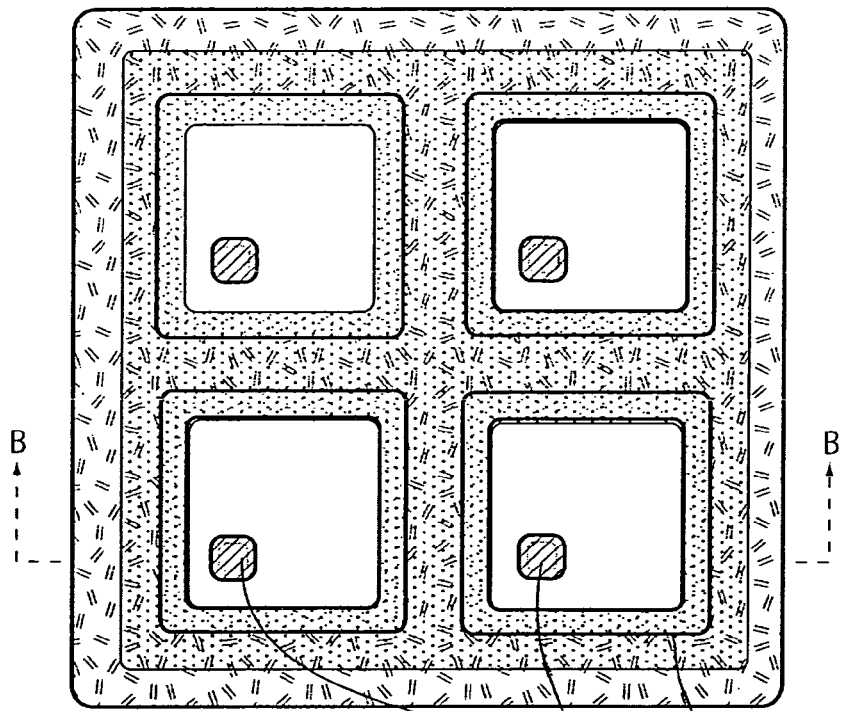
FIGS. 2(A) and 2(B) are explanatory illustrations of a compound semiconductor photo detecting array as a preferred second embodiment of this invention.
Figure 2B:
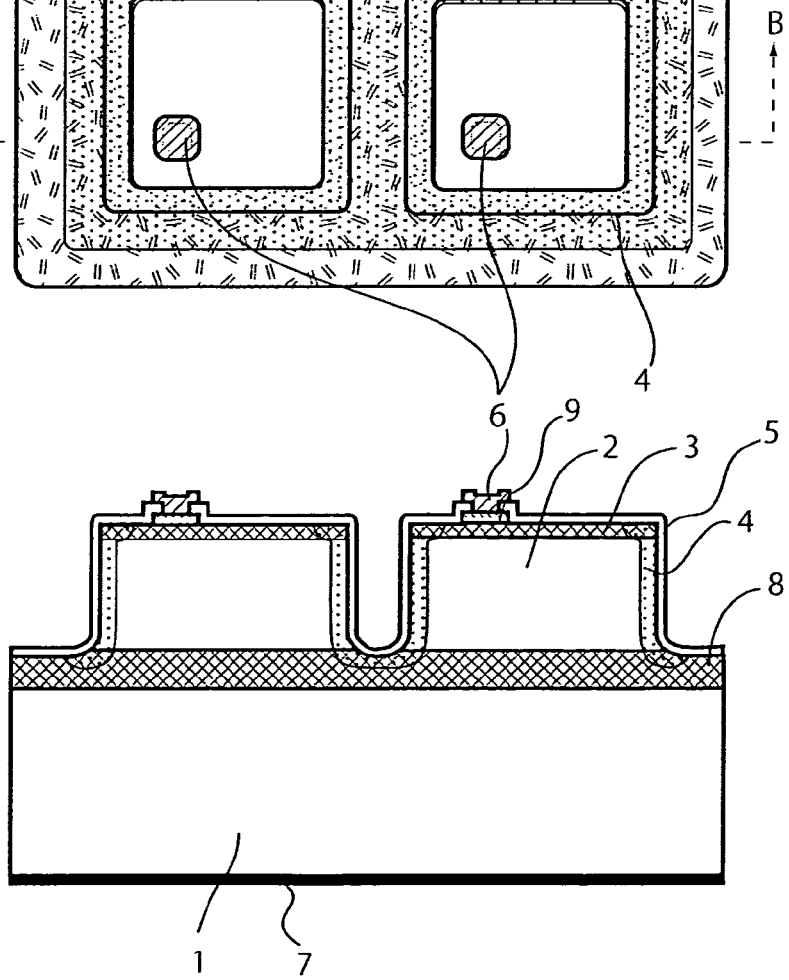

FIG. 2(A) shows a plan view and 2(B) shows cross-sectional view of a mesa isolated PD to the direction of the arrow B as an embodiment of the present invention. An island shape was formed by mesa etching of a wafer formed of an InGaAs photosensitive layer 2 and an N-type InP window layer 3, which were stacked on a P-type InP substrate 1. Then, a P-type layer 4 was formed by diffusing zinc selectively only to the mesa side and bottom. An N-type InGaAs contact layer was left in an island shape on the part of N-type InP window layer 3. The top surface, the mesa side and bottom were covered with a dielectric layer 5 formed of a silicon nitride film. Finally, an N-side electrode 6 was formed on the opening of the silicon nitride film. A P-type InP barrier layer is a buffer layer formed between a substrate and laminated epitaxial layers in order to improve the quality of the epitaxial crystal layer, and simultaneously works as an etch stop layer using etch selectivity during the mesa etching.

The P-type layer 4 formed on the surface of the mesa is obtained by doping zinc with a conventional thermal diffusion method and the diffused depth can be about 1 µm or less than that. It can also be formed by ion implanting of acceptor type impurities such as beryllium instead of a thermal diffusion method, and in this case an advantage is obtained such that the implanting impurity density can be controlled accurately as low as the P-type layer 4 is not depleted and tunneling current does not flow when the reverse bias is applied to the element. No problem is found even if the P-type layer 4 is formed by a conventional zinc diffusion method since the light-receiving element array works at a low reverse bias voltage bias of zero or less than 2V. The present embodiment brings an advantage of not requiring a negative power source since a positive voltage can be applied to the N side electrode 6 as it locates on the surface of the element, and the substrate can be commonly grounded, which is different from the conventional planar PDs or arrays with the InGaAs/InP system. It is also effective to insert single or plural semiconductor layers at the boundary of the photosensitive layer 2 and the window layer, or at the boundary of the photosensitive layer 2 and the buffer layer 8, in order to improve the crystal quality and to lower the hetero-barrier step for easing carrier flow.

In the structure disclosed by the document 7, zinc is diffused in the mesa top, the mesa sides and the mesa bottom to prevent the PN junction from exposing to the end face of the mesa. In this structure the PN junction formed by zinc diffusion is extending to the bottom of the N-type mesa. On the other hand, in the structure implemented by the present invention contrasted to the structure of the document 7, a buffer layer 8 to form a mesa bottom is P-type so that the PN junction remains inside the mesa region. Therefore, in the structure of the present invention, the junction capacitance is smaller, and higher in the response speed, and the dark current can be reduced as much as the difference in the PN junction area, and better detector sensitivity can be obtained. This difference is based on the difference between either doping the mesa surface with the conductivity type different from the conductivity type of the substrate or the light-absorbing layer as stated in the document 7, or doping with the same conductivity type as the present invention. In the structure of the document 7, as the PN junction is formed by zinc diffusion that is difficult to control the diffusion depth less than 0.2 µm, the width of the light transmission window becomes thicker which makes the detection wave length range narrower, and also it is disadvantageous in characteristics uniformity and in production yield due to a thermal diffusion method. In the document 7, it is disadvantageous in making a fine pitch array since an electrode must be formed in the mesa bottom.

Figure 6:
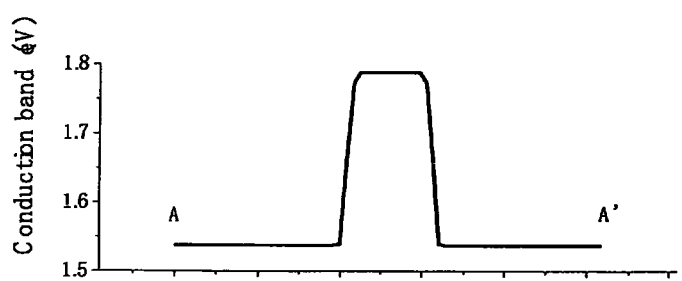
FIG. 6 is an explanatory illustration of the conduction band potential profile in the horizontal direction and the separation performances in adjacent elements of a compound semiconductor photo detector embodied by this invention.
Figure 6:
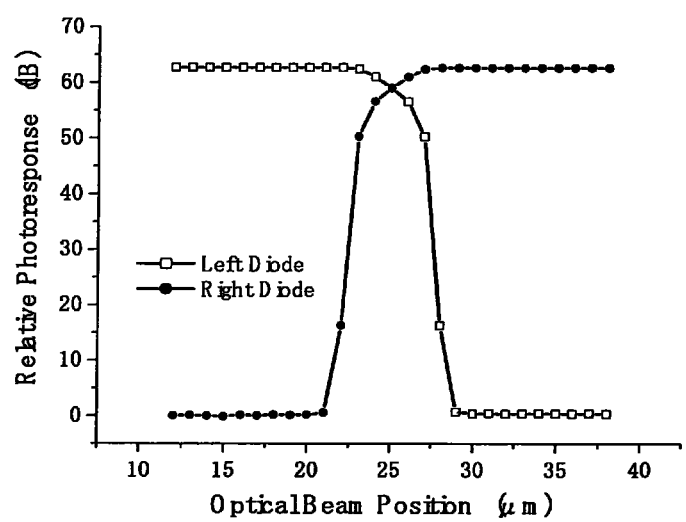

In the PN type phototransistor disclosed in FIG. 6 of the document 8 by the present inventors, low leakage characteristics equivalent to a planar type photodiode is obtained by diffusing zinc to the mesa surface after forming a mesa structure in double hetero-epitaxial layers. The document 8 and the present invention are similar in the intention to suppress the dark current increased by the surface current by preventing a PN junction in a narrow band gap light-absorbing layer from exposing on the crystal surface having many defects. However, the zinc diffused front is located in the N-type buffer layer in document 8 so that a PN junction is formed also in the N-type buffer layer, which increases the stray capacitance. In addition, it was necessary to form an NPN structure in an N-type buffer layer to make a photo detector array, which has made isolation between elements complicate. In this invention, the PN junction is formed limitedly within the light-absorbing layer and its structure is advantageous in making the response speed higher as the junction capacitance is lower. In this embodiment, adjacent elements are isolated by mesa structures and electrically by the NPN junction so that the cross talk between elements is drastically reduced compared with conventional PD arrays.

The front of the P-type layer 4 formed by Zn diffusion can be remained within the buffer layer 8 or can reach to the P-type substrate penetrating the buffer layer 8. In addition, the P-type electrodes can be formed on the P-type layer 4 from the surface side of the device. In this case, the buffer layer 8 can be an N-type, and a substrate can be semi-insulating. In addition, fine pitch PD arrays can be obtained while removing damages induced by dry process, by using dry process for etching to make mesa structures and by making shallow impurity diffusion from the etched surface.

Example 3

Figure 3:
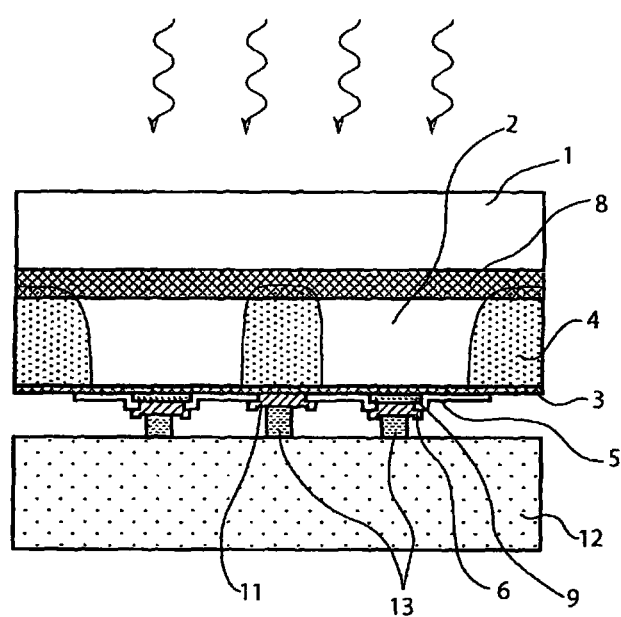
FIG. 3 is an explanatory illustration of a compound semiconductor photo detecting array as a preferred third embodiment of this invention.

FIG. 3 shows a one-dimensional array and two-dimensional array, in which incident light is illuminated on their substrate sides. In these cases, the P-type electrodes 11 are formed in contact with the diffused surface 4, and they are bonded with a read-out integrated circuit (ROIC) or a circuit board 12 via metal bumps 13. Such a flat surface structure array as shown in FIG. 1 is advantageous in terms of yield and reliability, because of easiness in the device fabrication process compared with mesa type arrays.

Example 4

Figure 4:
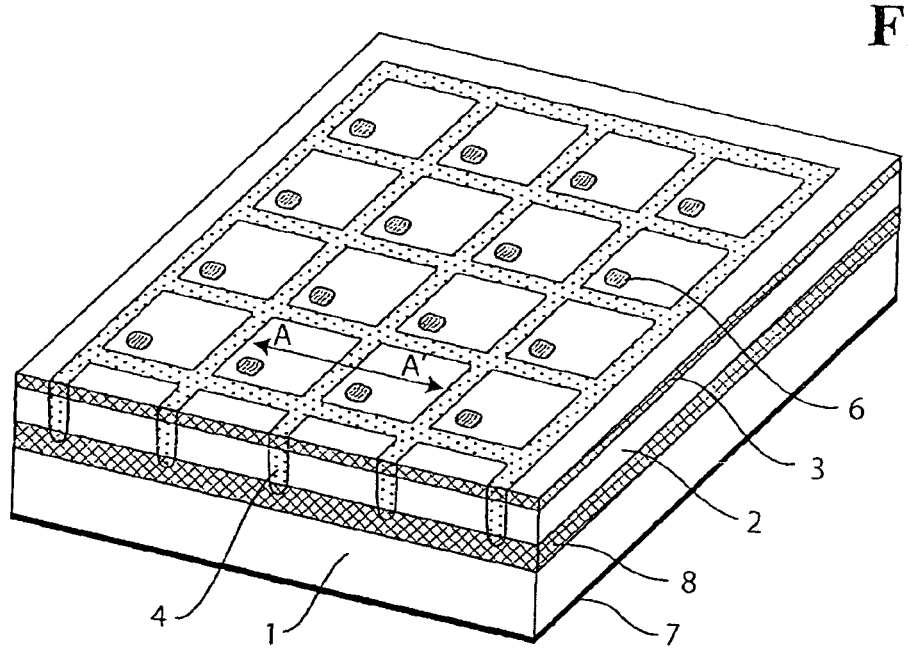
FIG. 4 is an explanatory illustration of a compound semiconductor photo detecting array as a preferred forth embodiment of this invention.
Figure 5:
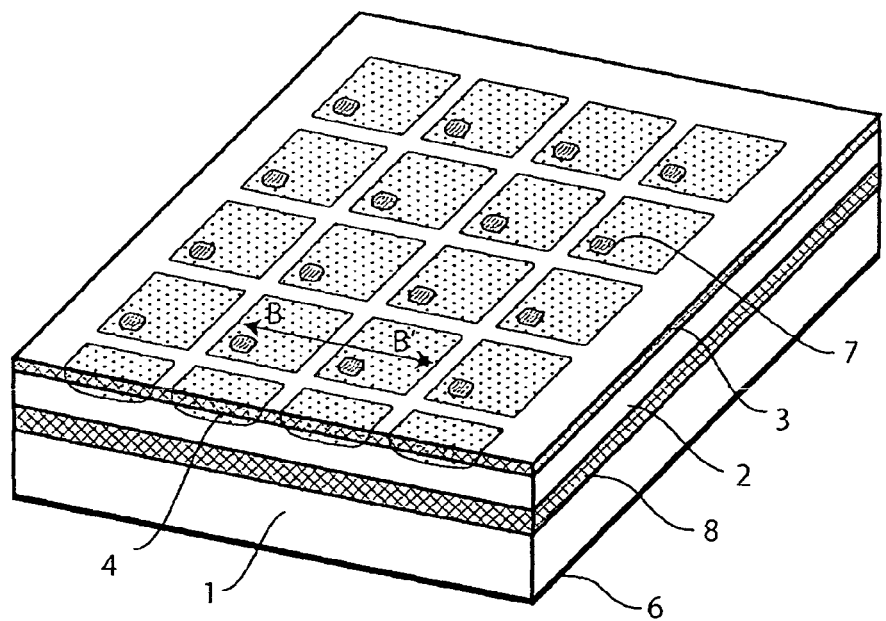
FIG. 5 is an example of a compound semiconductor photo detecting array formed by a conventional method.

FIG. 4 is an example of the present invention, in which multiple elements are placed in a matrix form. The photosensitive layer 2 is divided into each element by the zinc diffused P-type layer 4 which reaches to the buffer layer 8 in lattice shapes. On the other hand, FIG. 5 shows conventional planar PDs being arranged in a matrix form where shallow zinc diffused P-type layer 4 is formed for each element.

Figure 7:
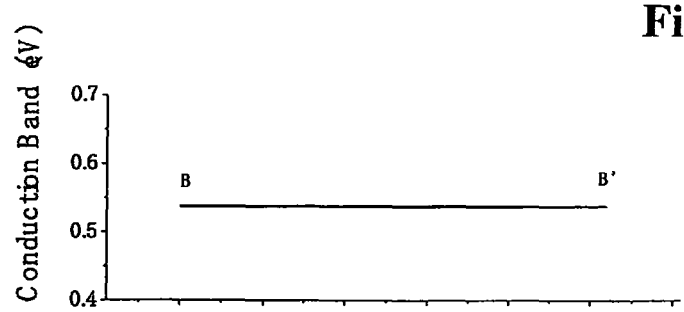
FIG. 7 is an explanatory illustration of the conduction band potential profile in the horizontal direction and the separation performances in adjacent elements of a conventional compound semiconductor photo detector.
Figure 7:
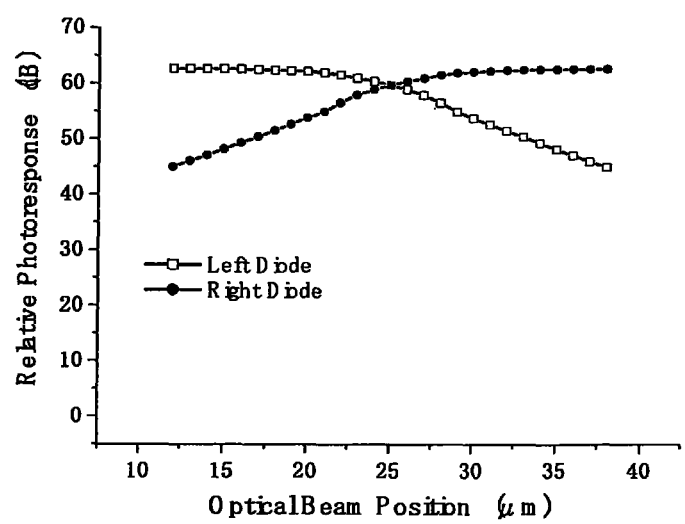

FIG. 6 shows the potential profile of the conductions band along the A-A' line over adjacent PD element boundaries, and the calculated photo-excited current induced in the left and right PD elements when light beam with the spot size of 1 µm is scanned along the arrow, in the PD array arranged with 10 µm space according to the present inventions shown in FIG. 4. FIG. 7 shows the potential profile of the conductions band along the B-B' line over adjacent PD element boundaries, and the calculated photo-excited current induced in the left and right PD elements when light beam with the spot size of 1 µm is scanned along the arrow, in the conventional PD array with 10 µm spacing. The thickness of the InGaAs photosensitive layer 2 is 2 µm and the potential of the conduction band at the middle of the photosensitive layer 2 is shown. The dark current when light is off is set at 0 dB.

In FIG. 6, the potential of the conduction band has raised about 0.3 eV in the region formed into the P-type layer by deep zinc diffusion sandwiched between adjacent elements. Therefore, electrons excited at the point A of the left element are impossible to move from the single element surrounded by the zinc diffused layer to its outside so that as much as 60 dB of signal separation between elements is achieved. On the other band, in FIG. 7, photosensitive layers of each element are connected and there is no potential barrier so that the signal separation remains less than about 20 dB. In order to improve the signal separation in a conventional array, it needs to expand the space between elements or to provide mesa separation.

In the case of infrared camera using a two-dimensional may, the element size must be less than 20 µm to make a VGA class resolution with the substrate size less than 10 mm. However, in a conventional planar PD combined with a shadow mask, the image resolution is degraded by the mutual diffusion of carriers. If a groove separation is provided to such a conventional array, increase of the dark current cannot be avoided due to surface crystal defects in the exposed edge. A high density PD array with a small dark current and high resolution can be realized for the first time by the present invention shown in the structures of FIG. 1(A), 1(B) or 2(A), 2(B). Moreover, when the present embodiments are applied to one-dimensional array for spectral sensing or a wavelength multiplexing optical communication system, much better wavelength resolution is obtained compared to the conventional PD arrays.

Figure 8:
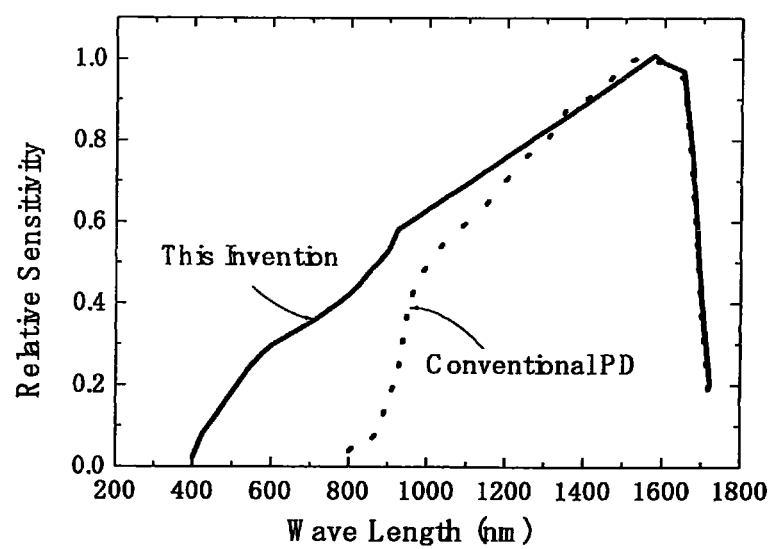
FIG. 8 shows characteristics of the spectral sensitivity of the compound semiconductor photo detector of the present invention compared with that of a conventional structure.

FIG. 8 shows the spectral sensitivity characteristics of the InP/InGaAs system PD implemented by the present invention, comparing relatively with typical value obtained by the conventional planar PD. In the conventional type, incident light has to pass through the zinc diffused layer of about 1 µm depth and optical absorption loss in the InP window layer is high before it reaches to the photosensitive layer so that sensitivity degrades rapidly in the short wavelength of less than 900 nm. On the other hand, in the present invention, the N-type InP window layer is formed by crystal growth and made with thickness less than 0.2 µm so that the short wavelength sensitivity is improved greatly as shown in FIG. 8. Further improvement in the short wavelength sensitivity can be realized by thinning the window layer.

Example 5

Figure 9A:
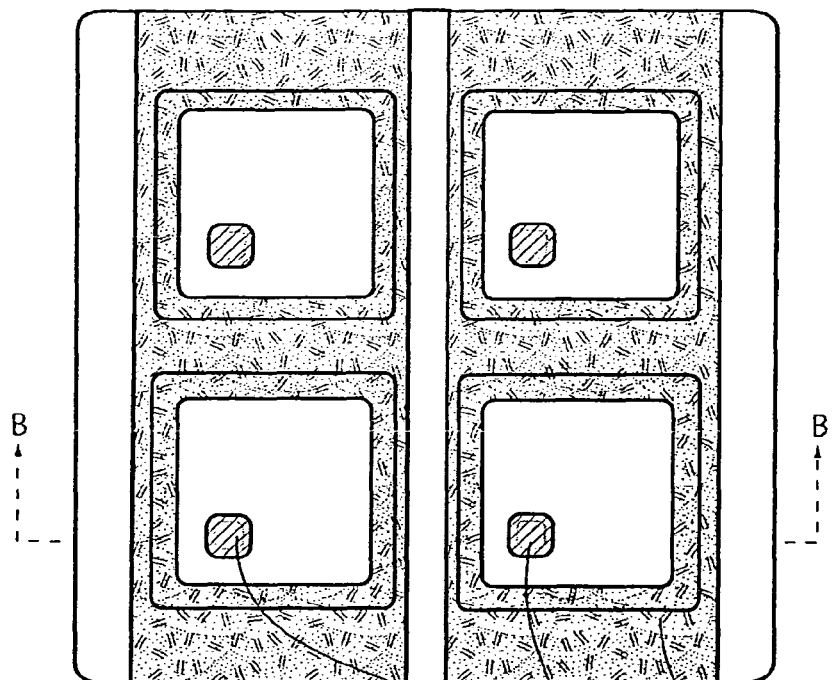
FIGS. 9(A) and 9(B) are explanatory illustrations of a compound semiconductor photo detecting array to allow individual address as a preferred fifth embodiment of this invention.
Figure 9B:
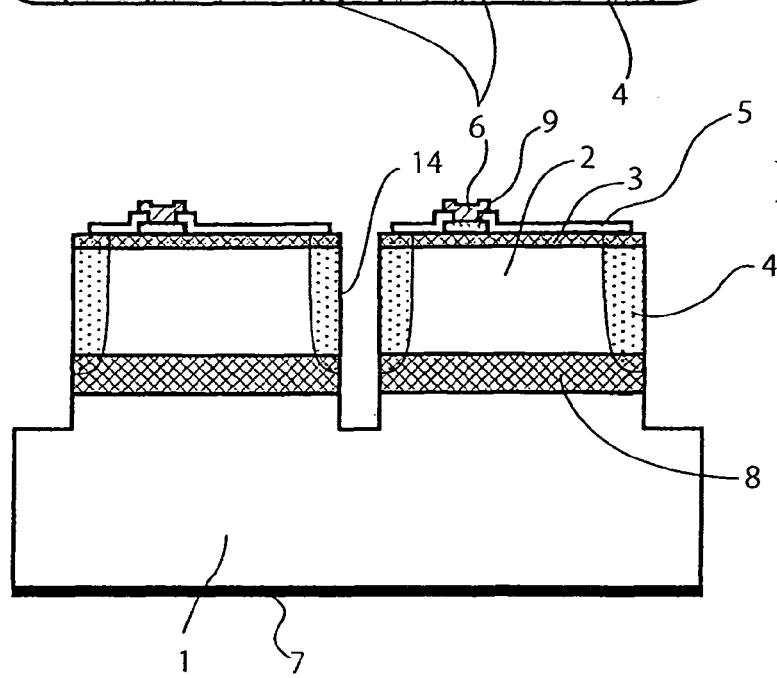

FIGS. 9(A) and 9(B) show embodiments of two-dimensional arrays electrically isolated among adjacent columns by forming grooves 14 in the zinc diffused layer to the depth reaching the substrate after forming the structure shown in FIGS. 1(A), 1(B). Columns of a two-dimensional array are isolated by grooves using a semi-insulating substrate. The groove 14 can be embedded with insulating materials such as polyimide to form a circuit pattern of a two-dimensional array on the insulating material.

In the above, embodiments of the present invention are presented in cases of using InP/InGaAs heterojunction and obviously the principle of the present invention can be configured with compound semiconductor materials formed of In, Al, Ga, As and Sb, and also, can be applied to the opposite conductivity type. In addition, when N-side electrodes and P-side electrodes are formed on the same plane as shown in FIG. 3, the substrate can be an insulating substrate or an N-type substrate.

Example 6

Figure 10A:
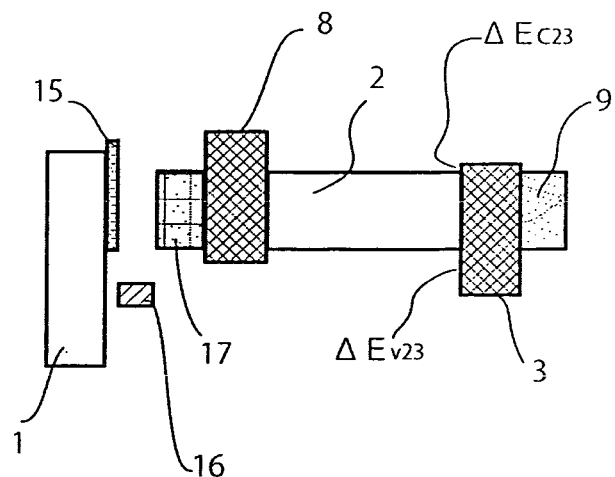
FIGS. 10(A) and 10(B) are explanatory diagrams to provide an expanded range of detecting wavelengths by adopting a light-absorbing layer with the InGaSb system as a preferred sixth embodiment of this invention.
Figure 10B:
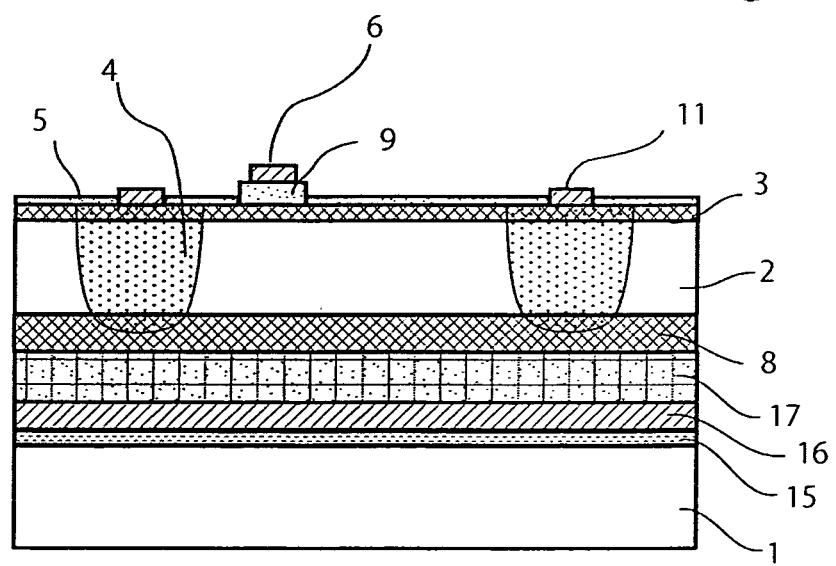

FIG. 10(A) shows the band profile where InGaSb ternary alloy is employed as a photo-sensitive region2 in order to extend the photo-sensitive wavelength to 2.4 microns. FIG. 10(B) shows a cross-section of the device. In this example, $InAs_{0.68}Sb_{0.32}$ lattice matched strain relaxation 16, which is lattice matched to $In_{0.25}Ga_{0.75}Sb$ photo-sensitive region 2, is formed on GaSb strain relaxation layer 15. Strain caused by the lattice mismatch between GaAs substrate1 is effectively relieved because critical stresses of GaSb and $InAs_{0.68}Sb_{0.32}$ is small. An $In_{0.22}Al_{0.23}Ga_{0.55}Sb$ layer with large band offset at conduction band is employed for the substrate side barrier layer 8, and an $In_{0.67}Al_{0.33}As_{0.41}Sb_{0.59}$ with large band offset at valence band is employed for the surface-side window layer 3, as an electron and hole barrier, respectively, so that dark current will not flow into the photo-sensitive region.

In this example, surface-side window layer 3 is an N-type. Band offset of the conduction band is smaller than that of the valence band because conduction band offset $\Delta Ec_{23}$ is 0.10 eV, and valence band offset $\Delta Ev_{23}$ is 0.26 eV, respectively at the hetero-interface between photo-sensitive region 2. Therefore, photo-generated carriers are extracted towards the surface-side window layer 3 without accumulation at the hetero-interface even at very weak incident light or low bias voltage condition. In addition, bandgap of the $In_{0.25}Ga_{0.75}Sb$ photo-sensitive region 2 is 0.51 eV, and those of $In_{0.22}Al_{0.23}Ga_{0.55}Sb$ substrate side barrier layer 8 and $In_{0.67}Al_{0.33}As_{0.41}Sb_{0.59}$ surface-side window layer 3 are 0.87 eV, respectively.

It is difficult to extract holes to the substrate side, because there is a large potential barrier in the valence band between $InAs_{0.68}Sb_{0.32}$ lattice matched strain relaxation layer 16 and GaSb strain relaxation layer 15. In the FIG. 10(B) according to this invention, holes can be extracted from the P-type surface-side electrodes 11 through P-type doped anode contact layer 17 and highly Zn-diffused layer 4. In case of surface illumination type photo-diode, window layer 3 should be exposed to the surface to preserve high quantum efficiency, by removing the N-type doped cathode contact layer 9 except for the region underneath the N-side electrode 6.

Example 7

Figure 11A:
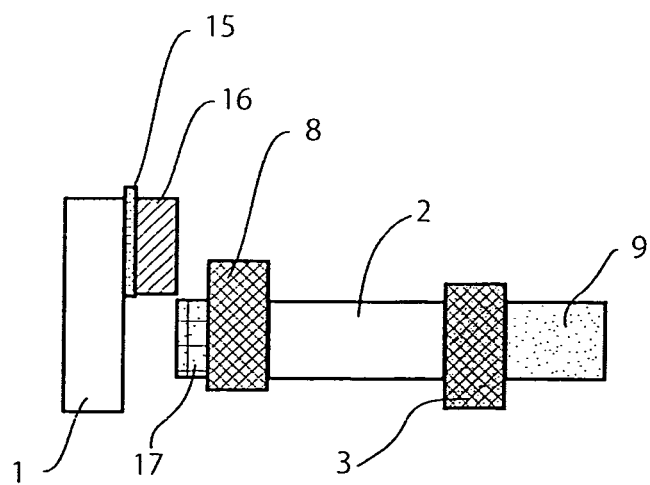
FIGS. 11(A) and 11(B) are explanatory diagrams to provide an expanded range of detecting wavelengths by adopting a light-absorbing layer with the InGaAs system as a preferred seventh embodiment of this invention.
Figure 11B:
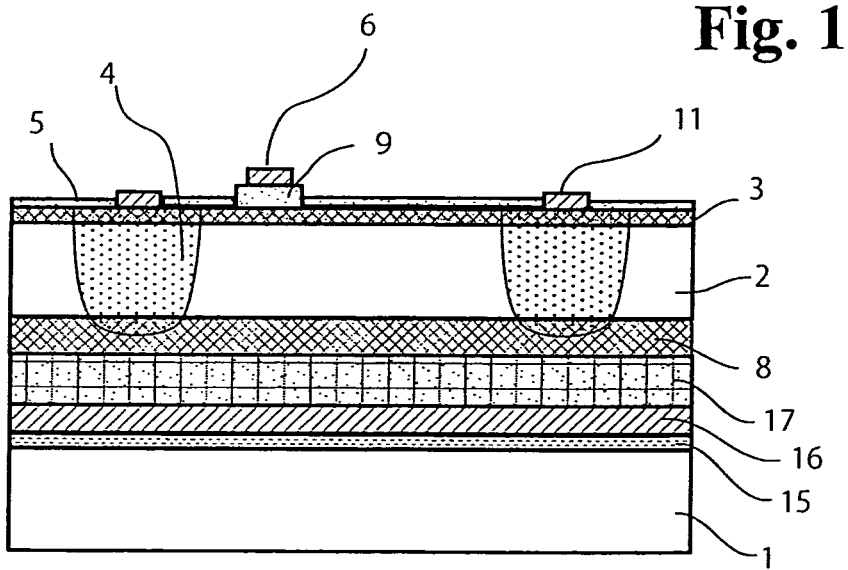

FIG. 11(A) shows the band profile where indium contents of the InGaAs photo-sensitive region 2 is increased in order to extend the photo-sensitive wavelength to 2.4 microns. FIG. 11(B) shows a cross-section of the device. In this example, $In_{0.76}Al_{0.24}As$ electron barrier layer 8 and $InAs_{0.5}P_{0.5}$ window layer 3 are lattice matched to $In_{0.77}Ga_{0.23}As$ photo-sensitive region 2 with the lattice constant of 5.87 angstroms. They prevent electron and holes generated outside of the photo-sensitive region 2 to inject into photo-sensitive region 2 by the potential barrier caused by the band offset between anode contact layer 17 and cathode contact layer 9, respectively. They also extract photo-induced electrons and holes generated in the photo-sensitive region 2 outside as a photo-response selectively. $GaAs_{0.31}Sb_{0.69}$ lattice matched to the $In_{0.77}Ga_{0.23}As$ photo-sensitive region 2 is formed on a GaSb strain relaxation layer 15 as a lattice matched strain relaxation layer 16 in order to relax the strain caused by a lattice mismatch between GaAs substrate 1. It is difficult to extract holes toward substrate because large potential barrier exists between the valence band of the $In_{0.76}Al_{0.24}As$ electron barrier layer 8 and $GaAs_{0.31}Sb_{0.69}$ lattice matched strain relaxation layer 16, and also, because crystalline defects such as misfit dislocations are accumulated at the interface. In the FIG. 11(B) according to this invention, holes can be extracted from the P-type surface-side electrodes 11 through P-type doped anode contact layer 17 and highly Zn-diffused layer 4. In case of a surface illumination type photo-diode, window layer 3 should be exposed to the surface to preserve high quantum efficiency, by removing the N-type doped cathode contact layer 9 except for the region underneath the N-side electrode 6.

In addition, bandgap of the $In_{0.77}Ga_{0.23}As$ photo-sensitive region 2 is 0.51 eV, and those of the $In_{0.76}Al_{0.24}As$ electron barrier layer 8 and $InAs_{0.5}P_{0.5}$ surface-side window layer 3 are 0.86 eV and 0.83 eV, respectively. In this example, window layer 3 is an N-type. Band offset of the conduction band is smaller than that of valence band because conduction band offset $\Delta Ec_{23}$ is 0.07 eV, and valence band offset $\Delta Ev_{23}$ is 0.24 eV, respectively at the hetero-interface between photo-sensitive region 2.

The example disclosed in FIG. 10 has more freedom in the conduction band gap and band offset design by employing the Sb based compound semiconductor materials. In contrast, the example disclosed in FIG. 11 has an advantage that InGaAs can be used as a photo-sensitive region in which material process and performance are much more established.

Example 8

Figure 12A:
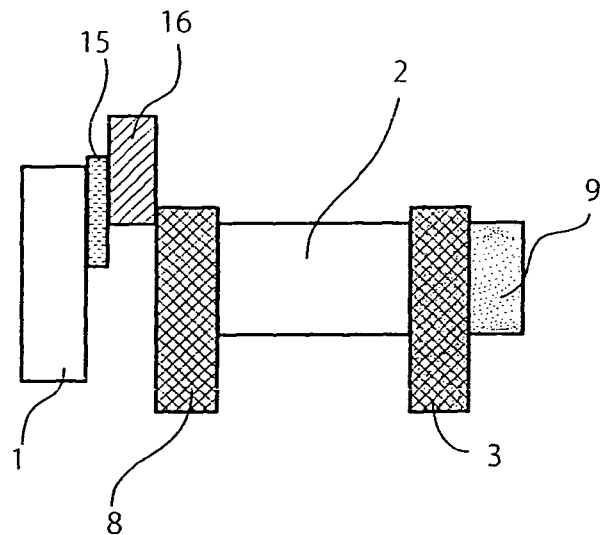
FIGS. 12(A) and 12(B) are explanatory diagrams to form the InGaAs/InP system PD on a GaAs substrate as a preferred eighth embodiment of this invention.
Figure 12B:
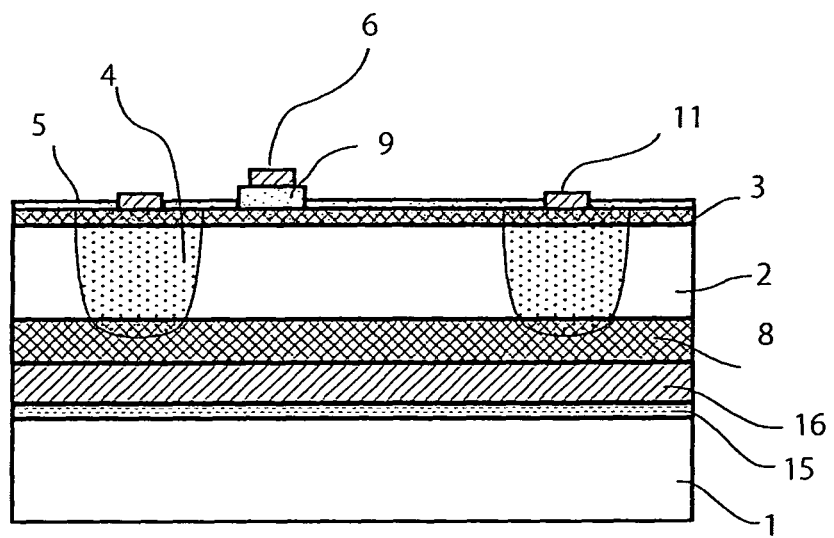

FIGS. 12(A) and 12(B) show compound semiconductor PD arrays in which InGaAs/InP PDs are formed on a GaAs substrate 1. After the GaSb strain relaxation layer 15 is grown on the GaAs substrate 1, a $GaAs_{0.5}Sb_{0.5}$ lattice matched strain relaxation layer 16 is grown. Then, an InP barrier layer 8, $In_{0.53}Ga_{0.47}As$ photo-sensitive layer 2, InP window layer 3, and $In_{0.53}Ga_{0.47}As$ cathode contact layer 9 are formed successively. Electron transport is smooth across the low carrier concentration hetero-interface because InP window layer 3 has a small barrier against electrons. In contrast, the barrier blocks the hole transport, however, hole transport toward the anode electrodes is performed with low resistance because high concentration Zn diffusion was made from the device surface to the P-type barrier layer 8 through the photo-sensitive layer 2 as shown in FIG. 12(B).

Example 9

Figure 13A:
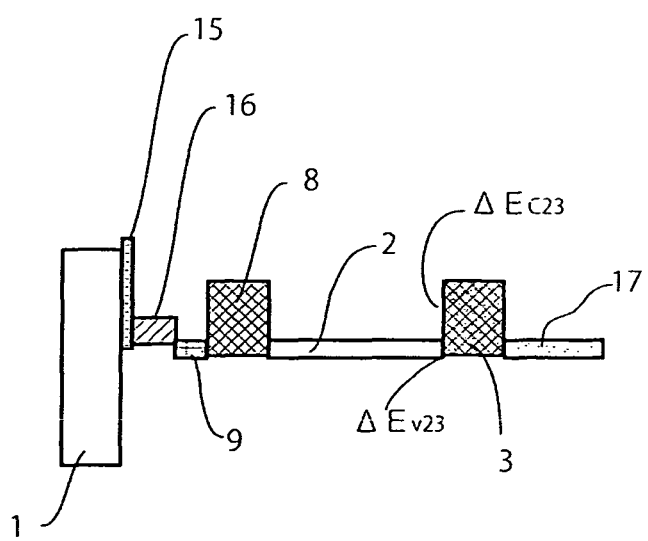
FIGS. 13(A) and 13(B) are explanatory diagrams to provide an expanded range of detecting wavelengths by adopting a light-absorbing layer with the InAsSb system as a preferred ninth embodiment of this invention.
Figure 13B:
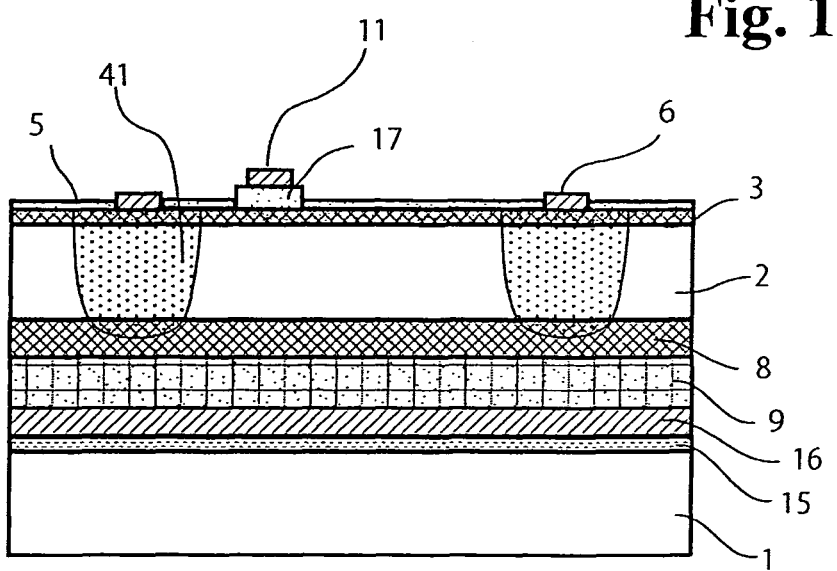

FIGS. 13(A) and 13(B) show a band profile and cross-section of the photo-detector with the sensitive wavelength band of 2 to 10 microns, respectively. After the GaSb strain relaxation layer 15 is grown on GaAs substrate 1, InSb strain relaxation layer 16, $InAs_{0.15}Sb_{0.85}$ cathode contact layer 9, N—$In_{0.82}Al_{0.18}Sb$ barrier layer 8, $InAs_{0.15}Sb_{0.85}$ photo-sensitive layer 2, N—$In_{0.82}Al_{0.18}Sb$ window layer 3 are formed successively.

Because $In_{0.82}Al_{0.18}Sb$ barrier layer 8 is lattice matched to $InAs_{0.15}Sb_{0.85}$ photo-sensitive layer 2 which has a lattice constant of 6.42 angstrom, crystalline defect generation caused by lattice strain is suppressed. $In_{0.82}Al_{0.18}Sb$ barrier layer 8 and $In_{0.82}Al_{0.18}Sb$ window layer 3 have barriers at the conduction band only. Therefore, InAsSb/InAlSb hetero-interface does not work as a current blocking layer in case when holes are extracted from P-type layers. In FIGS. 13(A) and 13(B), photo-sensitive region 2 and window layer 3 are set P-type, and Sn is selectively diffused as an N-type impurity. Band offset of the valence band is smaller than that of the conduction band because conduction band offset $\Delta Ec_{23}$ is 0.38 eV, and valence band offset $\Delta Ev_{23}$ is almost zero volts, respectively at the hetero-interface between photo-sensitive region 2. Therefore, photo-generated holes are extracted through anode contact layer 17 and P-side surface electrode 11 without potential barriers at InAsSb photo-sensitive layer 2 and InAlSb window layer 3, which are relatively low concentration P-type. Electrons can pass through the hetero-interface by a tunneling effect between highly N-type doped layer 41, which is a part of the $InAs_{0.15}Sb_{0.85}$ photo-sensitive layer 2, and $In_{0.82}Al_{0.18}Sb$ window layer 3. In addition, bandgap of the $InAs_{0.15}Sb_{0.85}$ photo-sensitive region 2 is 0.12 eV, and those of $In_{0.82}Al_{0.18}Sb$ substrate side barrier layer 8 and $In_{0.82}Al_{0.18}Sb$ surface-side window layer 3 are 0.49 eV, respectively.

GaAs substrates are less-expensive and large area wafers are available compared with InP substrates. Therefore, production cost of PDs is much reduced with the structure disclosed in FIGS. 10 to 13(B). The disclosed structure is also favorable for thinning the device for infrared cameras by removing the substrate with selective etchant. GaAs is etched by the mixture of phosphorous or sulfuric acid and hydrogen per oxide, while InP works as an etch stop layer against such solution.

Substrate 1 can be replaced to silicon which is less expensive and mechanically stronger than GaAs. In this case, thermal stress during the crystal growth and cooling process can be avoided by employing InSb as a buffer layer, in which mechanical strength is weak. Further, threading dislocations are effectively terminated by InSb quantum dots formed on InAlSb buffer layer.

1. Substrate
2 Photosensitive layer
3 Window layer
4 P-type layer
5 Dielectric layer
6 N-type electrode
7 P-type electrode
8 Buffer layer
9 Cathode contact layer
10 Opening
11 P-type surface electrode
12 Read Out IC
13 Bump
14 Groove
15 Strain relaxation layer
16 Lattice matched strain relaxation layer
17 Anode contact layer
41 N-type layer

What is claimed is:

1. A compound semiconductor-based photo-detector array comprising:
   a photo-sensitive layer comprising a narrower energy bandgap and formed of a first conduction type;
   a barrier layer comprising a wider energy bandgap compound semiconductor and formed of a second conduction type, said barrier layer being formed under the photo-sensitive layer;
   a window layer of the first conductivity type comprising a compound semiconductor with a wider energy bandgap and formed on said photo-sensitive layer;
   wherein boundaries between the photo-sensitive layer and window layer of each of elements are at least doped with a second conductivity type impurity in a ring or lattice shape in plane to isolate the adjacent elements, and
   said photo-sensitive layer has an NPN or PNP structure adjacent to each other in a lateral direction.

2. A compound semiconductor-based photo-detector array according to claim 1, wherein the boundaries between the photo-sensitive layer and window layer are isolated with a mesa structure; and surfaces of the mesa structure at mesa-side walls and bottom part thereof are doped with the second conductivity type impurity to form a mesa type compound semiconductor-based photo-detector array.

3. A compound semiconductor-based photo-detector array according to claim 1, wherein in case a band offset of conduction and valence band at a bonding surface between said window layer and said photo-sensitive layer are defined as $\Delta Ec_{23}$ and $\Delta Ev_{23}$, respectively, $\Delta Ec_{23}$ is smaller than $\Delta Ev_{23}$ when said window layer is P-type, while $\Delta Ec_{23}$ is larger than $\Delta Ev_{23}$ when said window layer is N-type.

4. A compound semiconductor-based photo-detector array according to claim 1, wherein N and P type electrodes are formed at opposite sides of a substrate and an incident light is projected from a substrate side.

5. A compound semiconductor-based photo-detector array according to claim 1, wherein a photo-sensitive region is formed on a strain relaxation layer in which a lattice constant is different from a substrate.

6. A compound semiconductor-based photo-detector array according to claim 1, wherein the boundaries between the photo-sensitive layer and window layer are electrically isolated with the doped second conductive type impurity extending from the window layer to the barrier layer; and no step is formed for isolation of the elements to form a planar type compound semiconductor-based photo-detector array.

7. A compound semiconductor-based photo-detector array according to claim 1, wherein the second conductive type impurity is Zn.

* * * * *